United States Patent
Qin et al.

(10) Patent No.: US 7,776,661 B2
(45) Date of Patent: Aug. 17, 2010

(54) NANO-ELECTROMECHANICAL CIRCUIT USING CO-PLANAR TRANSMISSION LINE

(75) Inventors: Hua Qin, Madison, WI (US); Hyun Seok Kim, Madison, WI (US); Robert H. Blick, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 548 days.

(21) Appl. No.: 11/776,254

(22) Filed: Jul. 11, 2007

(65) Prior Publication Data

US 2009/0015351 A1 Jan. 15, 2009

(51) Int. Cl.
*H01L 21/00* (2006.01)
(52) U.S. Cl. .................. 438/144; 438/142; 333/187
(58) Field of Classification Search ............ 438/144, 438/142; 333/187
See application file for complete search history.

(56) References Cited

U.S. PATENT DOCUMENTS

| | | | |
|---|---|---|---|
| 6,946,693 B1 * | 9/2005 | Scheible et al. | 257/213 |
| 7,214,571 B2 * | 5/2007 | Scheible et al. | 438/144 |
| 7,414,437 B1 * | 8/2008 | Blick et al. | 326/101 |
| 7,597,788 B2 * | 10/2009 | Visel et al. | 204/400 |
| 2006/0011998 A1 * | 1/2006 | Scheible et al. | 257/414 |
| 2008/0061700 A1 * | 3/2008 | Blick | 315/5 |
| 2009/0015351 A1 * | 1/2009 | Qin et al. | 333/187 |

OTHER PUBLICATIONS

Legagneux, P. et al., High Current Density (>1 A/CM²) Cathodes Based on Carbon Nanotubes for Vacuum Microwave Amplifiers, Sep. 4-8, 2006, TNT2006 Conference (Keynote).
Minoux, Eric, et al., Achieving High-Current Carbon Nanotube Emitters, Nano Letters 2005, vol. 5, No. 11 pp. 2135-2138, Oct. 10, 2005 (Published on Web).
Teo, Kenneth B.K., et al. Carbon nanotubes as cold cathodes, Nature, p. 968, vol. 437, Oct. 13, 2005.

* cited by examiner

*Primary Examiner*—Laura M Menz
(74) *Attorney, Agent, or Firm*—Boyle Fredrickson, S.C.

(57) ABSTRACT

A co-planar waveguide structure is integrated with an upwardly extending resonant pillar to produce transfer cells that provide controlled transmission of electricity between adjacent structures of the co-planar waveguide in order to produce easily fabricated electronic devices operating at megahertz and gigahertz speeds for filtration, modulation, rectification, and mixing of high-frequency signals.

7 Claims, 4 Drawing Sheets

NANO-ELECTROMECHANICAL CIRCUIT USING CO-PLANAR TRANSMISSION LINE

STATEMENT REGARDING FEDERALLY SPONSORED RESEARCH OR DEVELOPMENT

This invention was made with United States government support awarded by the following agency:
USAF/AFOSR F49620-03-1-0420
The United States government has certain rights in this invention.

BACKGROUND OF AT LEAST ONE EMBODIMENT OF THE INVENTION

The present invention relates to microwave and higher frequency electronic devices and in particular to a versatile electromechanical device for processing high frequency electric signals and that is readily fabricated using conventional integrated circuit techniques.

The marriage of electrical and mechanical elements to provide for the processing of high frequency electric signals is well-known, for example, as performed by surface acoustic wave (SAW) devices in which the propagation of Rayleigh waves in a piezoelectric solid are used to produce electrical filters, delay lines and transformers. More recently micro electromechanical systems (MEMS) and nanoscale electromechanical systems (NEMS) have been used to create mechanical resonators operating in excess of one megahertz for filtration and other purposes. These mechanical devices provide extremely high quality factors (Q) but may require intricate fabrication processes for producing overlapping plates or cantilevered beams suspended above and parallel to a substrate.

U.S. Pat. No. 6,946,693, issued Sep. 20, 2005, naming one of the co-inventors of the present application, assigned to the assignee of the present application and hereby incorporated by reference, describes an electromechanical element in which a nanoscale pillar extending upward from a substrate is excited into mechanical resonance to produce a charge transfer between adjacent conductors at that resonant frequency, used, for example, for switching or filtering. The scale of the pillar is such as to permit megahertz and gigahertz operation. The orientation of the pillar, generally perpendicular to the face of the substrate, permits simple fabrication without the need for undercut elements or the creation of sacrificial support layers.

Practical implementation of MEMS and NEMS megahertz and gigahertz signal processing devices is hampered by the difficulty of communicating signals among the devices and between the devices and external circuit elements.

SUMMARY OF THE INVENTION

The present inventors have recognized that organization of the nanoscale pillars of U.S. Pat. No. 6,946,693 provides current flow that is substantially constrained to planar flow along the substrate, making them uniquely suited for combination with a co-planar waveguide, the latter which collapses the three dimensional structure of a conventional waveguide into planar form. The two structures, in combination, provide flexible building blocks for signal processing and a simple means for interconnecting those blocks, both of which are readily fabricated using simple integrated circuit fabrications techniques.

In this respect, the nanoscale pillars provide a natural communication pathway between co-planar elements of such wave-guides, and the waveguides provide the means for communicating signals to and from the nanoscale pillars.

The present inventors have also recognized that the nonlinear characteristic of the resonating pillars also makes it possible to construct more complex electronic devices such as mixers, rectifiers, and modulators, beyond simple switches and filters.

Specifically then, the present invention provides an electronic device having a co-planar waveguide providing a central conductor for receiving an input signal at a waveguide input and providing an output signal at a waveguide output. The central conductor is supported by an insulating planar substrate and flanked by co-planar ground conductors also supported by the insulating planar substrate. At least one mechanically resonant pillar extends upward from the insulating planar substrate within the co-planar waveguide, the mechanically resonant pillar supporting a conductor transferring electrons from the central conductor, as received from the waveguide input, to a second conductor, with mechanical movement of the resonant pillar.

It is thus one feature of at least one embodiment of the invention that it provides planar-organized circuit elements joined with a planar-organized interconnection system to permit flexible and simple combinations of one or more circuit elements arrayed on a planar substrate.

The central conductor may include a gap between the waveguide input and the waveguide output, and the mechanically resonant pillars may be positioned within the gap to transfer electrons from the central conductor on one side of the gap near the waveguide input to the central conductor on the other side of the gap near the waveguide output. Alternatively, the mechanically resonant pillar may be positioned between the central conductor and at least one flanking ground conductor or a supplemental conductor to transfer electrons between the central conductor and a ground point.

Thus, it is an aspect of at least one embodiment of the invention to provide a building block circuit element that may be used to produce either bandpass or band reject filters.

The electronic device may further include a direct-current (DC) bias source in series with a low pass filter providing current transferred by movement of the mechanically resonant pillar.

It is thus an aspect of at least one embodiment of the invention to permit control of the operating bias of the mechanically resonating pillar to produce a variety of different electronic devices such as mixers, modulators, and rectifiers.

The electronic device may further include a co-planar supplemental conductor isolated from the flanking ground conductors and the central conductor and passing through at least one ground conductor as also supported by the insulating planar substrate and isolated from the ground conductors.

Thus, it is an aspect of at least one embodiment of the invention to permit the introduction of different signals or bias currents across different mechanically resonant pillars.

The electronic device may include at least two mechanically resonant pillars having substantially identical natural resonant frequencies.

It is thus an aspect of at least one embodiment of the invention to provide for control of current flow and thus control of impedance and impedance matching independently of the control of the resonant frequency of the mechanically resonant pillar.

The electronic device may provide multiple mechanically resonant pillars having different natural resonant frequencies.

It is thus another aspect of at least one embodiment of the invention to provide for a tailoring of an arbitrary bandpass or band reject profile using multiple tunable elements.

The invention further covers a method of fabricating the electronic device as described including the steps of etching an insulated substrate to produce an upstanding pillar having a natural mechanical resonance of greater than 1 MHz and supports for the co-planar waveguide.

It is thus another aspect of at least one embodiment of the invention to provide a simple fabrication method for megahertz and gigahertz devices.

These particular aspects and advantages may apply to only some embodiments falling within the claims and thus do not define the scope of the invention.

DETAILED DESCRIPTION OF THE PREFERRED EMBODIMENT

Figure 1:
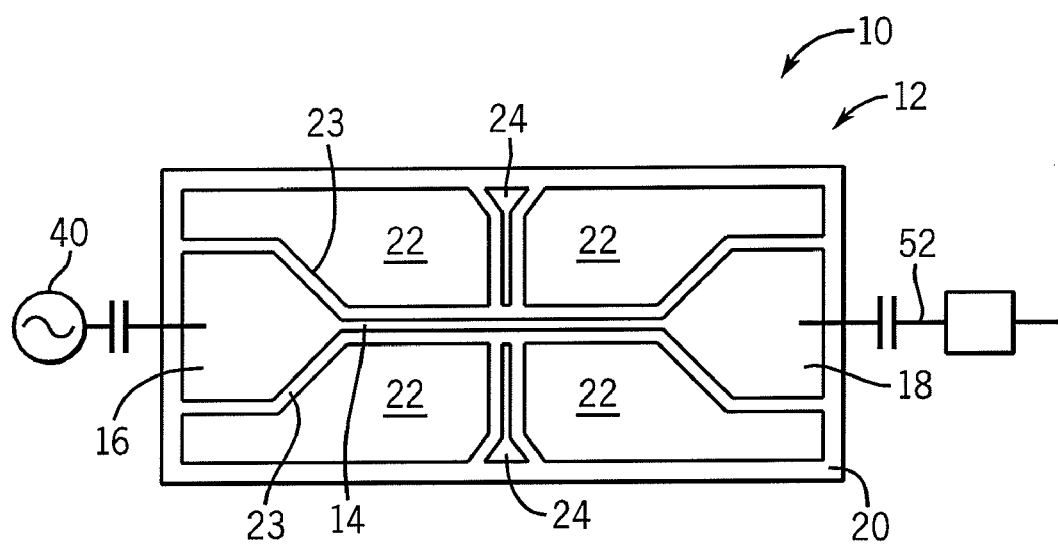
FIG. 1 is a top plan view of a co-planar waveguide forming part of the present invention, the waveguide providing a central conductor, flanking ground conductors, and optional supplemental conductors passing through the ground conductors.

Referring now to FIG. 1, a high frequency electronic device 10 per the present invention provides a co-planar waveguide 12 having a central conductor 14 leading between a waveguide input 16 and a waveguide output 18. The ends of the central conductor 14 near the waveguide input 16 and waveguide output 18 may be tapered outward to a greater width to provide for ease of connection to other circuit elements.

Generally parallel to the plane of the substrate 20, and in a common plane with the central conductor 14, are flanking co-planar ground conductors 22 spaced from the central conductor 14 by small gaps 23. The gaps 23 provide the dielectric of a predefined capacitance that together with the intrinsic inductance of the central conductor 14 produce the characteristic impedance of the co-planar waveguide 12 allowing impedance matched, low-loss transmission of high-frequency signals in the megahertz or gigahertz range.

The flanking co-planar ground conductors 22 may be unbroken on each side of the central conductor 14 or may have small channels, for example, perpendicular to the central conductor 14 allowing the passage of one or more co-planar supplemental conductors 24, between elements of the co-planar ground conductors 22. The supplemental conductors 24 are thus ohmically isolated from the co-planar ground conductors 22 by gaps 28. These supplemental conductors 24 allow the conduction of a signal from outside of the co-planar waveguide 12 to a point proximate to the central conductor 14 with minimal disruption to the properties of the co-planar waveguide 12.

Figure 2:
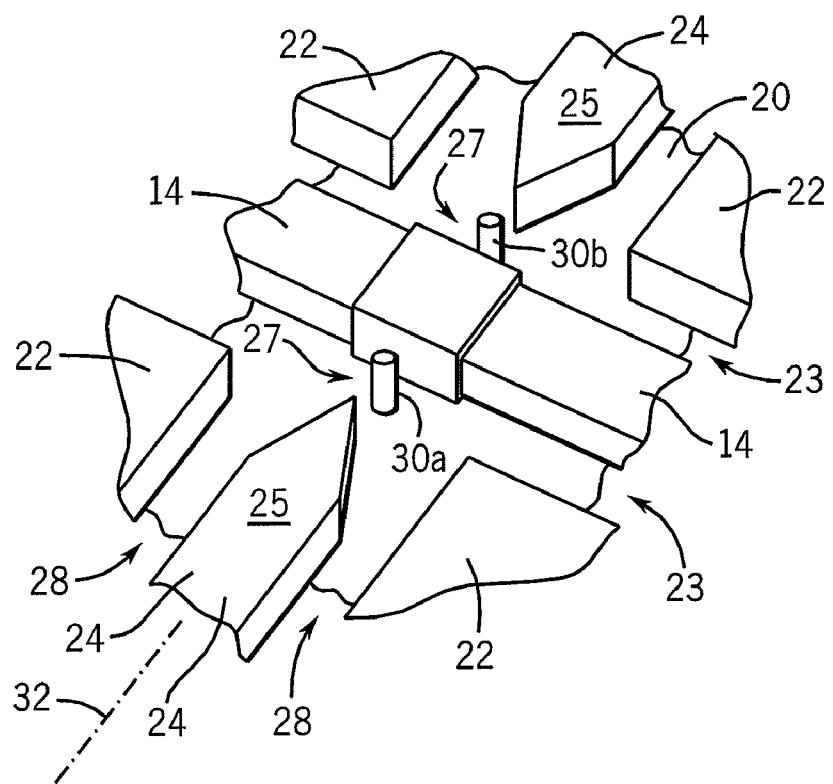
FIG. 2 is a perspective fragmentary view of the intersection of the central conductor and the supplemental conductors of FIG. 1 showing mechanically resonant pillars positioned therebetween.

Referring now to FIG. 2, the proximate ends 25 of two supplemental conductors 24 may be spaced from the central conductor 14 to admit between each of the proximate ends 25 and the central conductor 14, a mechanically resonant pillar 30a or 30b. The resonant pillars 30a and 30b extend perpendicularly from a plane of the substrate 20 so that their upper, free ends may bend within the plane of the central conductor 14, the supplemental conductors 24, and the co-planar ground conductors 22. Typical dimensions for the pillars 30 include a vertical height (perpendicular to the plane of the substrate 20) in the range of 100 nm to 2,000 nm and horizontal dimensions (cross-sectional width or diameter) in the range of 20 nm to 200 nm; however, other dimensions may also be used.

Each mechanically resonant pillar 30a and 30b, together with the adjacent portions of the central conductor 14 and the proximate ends 25 of the supplemental conductors 24, form a transfer cell 27 controllably transferring charge between the central conductor 14 and the supplemental conductors 24 by oscillation of the respective pillar 30. Specifically during the operation of the electronic device 10 of FIGS. 1 and 2, the pillars 30a and 30b resonate transversely along axis 32 perpendicular to the axis of the central conductor 14. The upper ends of the pillars 30a and 30b are conductive, and during each cycle of their oscillation, shuttle charges, carried by their conductive portions, between the proximate ends 25 of the supplemental conductors 24 and the central conductor 14. The transfer of charge between the pillars 30 and the supplemental conductors 24 or central conductor 14 may be by tunneling, field emission, ionization, or direct mechanical contact. The construction of pillars 30a and 30b and their excitation into transverse oscillation is described in the above-cited U.S. Pat. No. 6,946,693. The present invention, however, is not limited single transverse mode of oscillation but may use multiple and different mechanical modes, i.e. including harmonics and sub-harmonics of a fundamental mode within the same pillar 30.

The pillars 30 may be excited into oscillation by the application of an oscillating (AC) electrical signal or by "self excitation" in which a DC electrical signal is applied across the pillar 30, for example, between the central conductor 14 and a supplemental conductor 24, and the pillar 30 begins to oscillate based upon a mechanical instability fostered by the properties of the pillar 30 and the electric fields surrounding it.

The central conductor 14, the supplemental conductors 24, the co-planar ground conductors 22, and the conductive portion of the top of the pillars 30 are, preferably, conductive material supported on an etched structure in the surface of an insulating material forming the substrate 20. For example, the high frequency electronic device 10 may be formed on a semiconductor on insulator (SOI) wafer wherein the substrate 20 is an insulating layer (e.g., silicon dioxide), and the central conductor 14, the supplemental conductors 24, the co-planar ground conductors 22, and the conductive portion of the top of the pillars 30 are highly doped semiconductor layers or a layer of metal, such as gold, on top of the insulating layer. Other possible substrates include diamond as well as piezoelectric materials.

Figure 3:
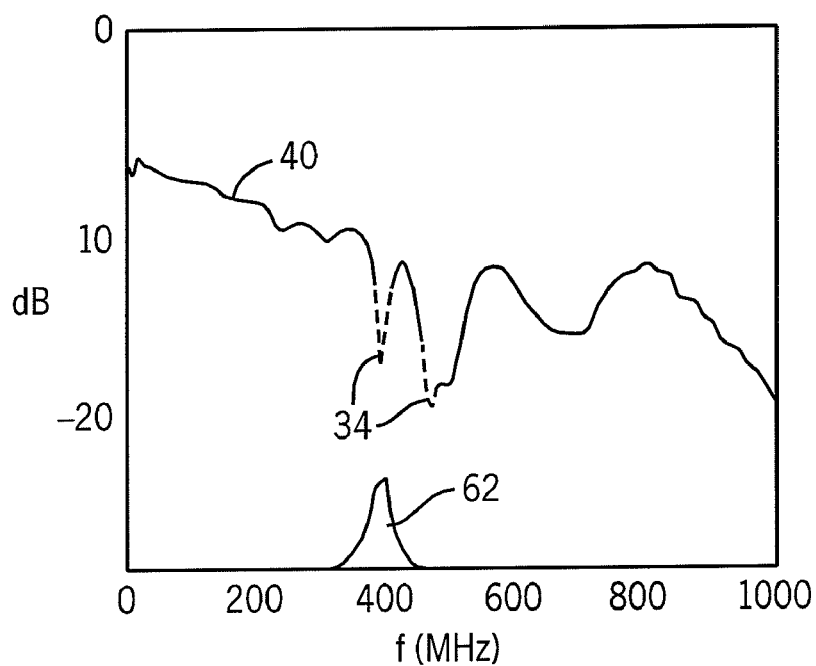
FIG. 3 is a plot of signal magnitude as a function of frequency for the devices of FIGS. 2 and 6 showing rejection bands and a pass band at the resonant frequency of the mechanically resonant pillars.

Referring now to FIGS. 1, 2 and 3, in one embodiment of the invention, the mechanically resonant pillar 30a may have a lower resonant frequency than the mechanically resonant pillar 30b, for example, by providing a greater pillar diameter to pillar 30a or a greater mass or moment arm to pillar 30a or the like. An input signal 40 (in this case a broad spectrum signal) introduced to the central conductor 14 at the waveguide input 16 will thus excite each of the mechanically resonant pillars 30a and 30b into oscillation at their different eigen modes or natural resonant frequencies. The supplemental conductors 14 may be grounded, in this example, thereby promoting a conduction of electrons from the central conductor 14 to grounded supplemental conductors 24 at those frequencies of resonance of the pillars 30. This frequency selective conduction causes a decrease in the transmission of the input signal 40 to the waveguide output 18 at rejection bands 34 corresponding in frequency to the natural resonant frequencies of the pillars 30.

It will be understood that the resonant frequencies of the pillars 30 may be tuned to change the center frequencies of these rejection bands 34, and that multiple different pillars 30 of different sizes may be used to provide different frequencies of rejection bands 34, and that multiple pillars 30 of same size may be provided to control the current flow (attenuation) of the rejection bands 34 so that an arbitrary rejection filter profile may be created. The pillars 30 have extremely high quality values providing for comparably sharp rejection bands 34 and thus comparably high-resolution control of the filter profile.

Figure 4:
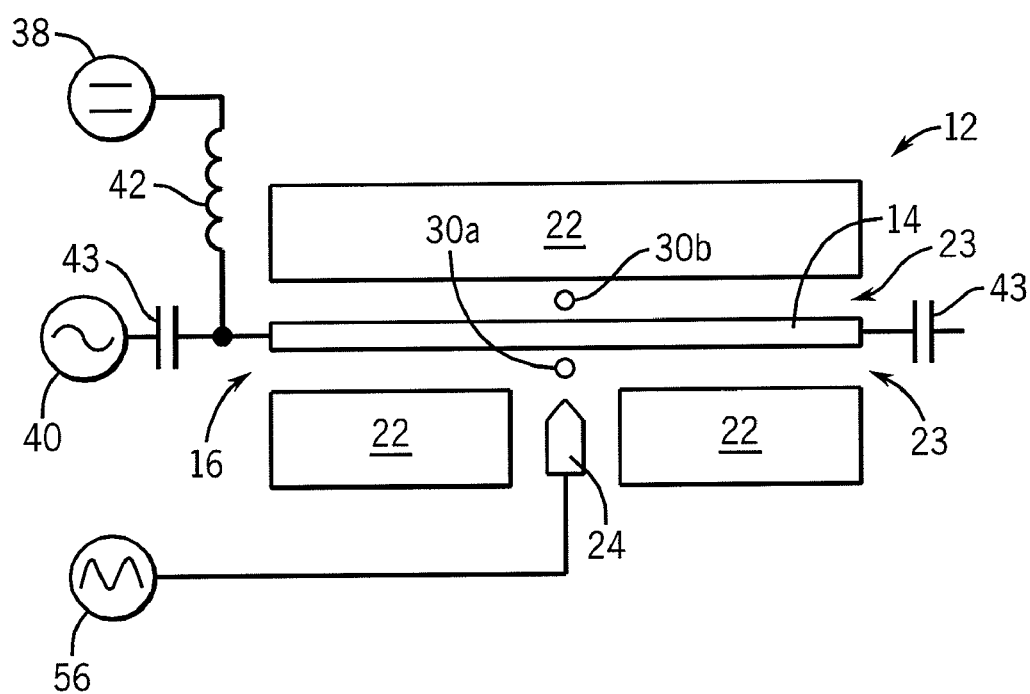
FIG. 4 is a schematic top plan representation of the device of FIG. 1 with one supplemental conductor having a signal applied thereto per an alternative embodiment of the invention in which the ground plane is used instead of one supplemental conductor as a ground path.

Referring now to FIG. 4, in a band rejection filter, the pillars (e.g., pillar 30b) need not be positioned between the central conductor 14 and a supplemental conductor 24 but may in fact be positioned between the central conductor 14 and one of the co-planar ground conductors 22 to equal effect.

Figure 5:
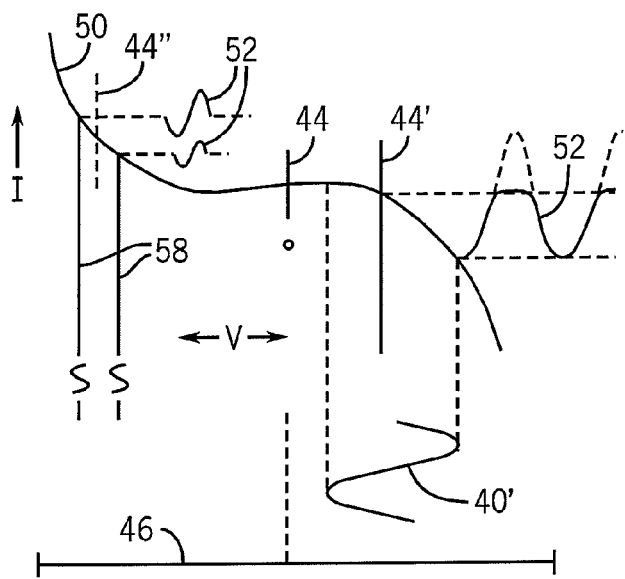
FIG. 5 is a plot of the current-voltage (IV) characteristics of a transfer cell provided by a mechanically resonant pillar showing different biases employed to operate the device in different modes for mixing, modulation, rectification, and filtration.

Referring now to FIGS. 4 and 5, a direct-current (DC) bias voltage 38 may be introduced to the central conductor 14 via the waveguide input 16 along with the input signal 40 (which may be narrow or wideband) to be processed. The direct-current bias voltage 38 may be introduced for example through a bias-tee circuit providing a high-frequency blocking element 42 (e.g., an inductor) between the direct-current bias voltage 38 and the waveguide input 16, and a DC blocking element 43 (e.g., a capacitor) between the input signal 40 and the waveguide input 16, to prevent interference between the input signal 40 and the direct-current bias voltage 38. A second DC blocking element 43 may be placed on the waveguide output 18 to remove the DC bias from the output signal 52.

Referring now to FIG. 5, each transfer cell 27 exhibits a characteristic IV-curve curve 50 at the resonant frequency of its pillar 30, IV-curve 50 generally providing zero current flow across the transfer cell 27 for low bias voltages with increasing current flows of opposite polarity with correspondingly increasing bias voltages.

Referring to FIGS. 4 and 5, in a first application of the invention, the electronic device 10, a direct-current bias level may be set to zero as indicated by bias line 44 (for example by eliminating the direct-current bias voltage 38). This bias is suitable when the electronic device 10 is used as a filter and centers any signal excursions 46 of the input signal 40 about a center of the IV-curve 50. Provided the signal excursions 46 are of sufficiently high magnitude, this biasing provides bipolar current flow through the transfer cell 27.

Alternatively, the direct-current bias level may be adjusted to bias level 44' near a knee of the IV curve 50 and a lower amplitude input signal 40' employed to promote current flow in only one direction (depending on the direction of displacement of the bias voltage from the zero point) providing a rectified output signal 52 from the waveguide output 18.

Alternatively, the direct-current bias level may be adjusted to a bias level 44" intersecting a slope of the IV-curve 50 and the bias level 44" may be further modulated in time, for example, through modulation signal 56 attached to a supplemental conductor 24, to provide a varying bias level 44" moving between bias points 58. Applying the input signal 40 to the IV-curve 50 at these different bias levels effectively modulates the input signal 40 by the modulation signal 56, changing the amplitude of the output signal 52 as a function of the modulation signal 56, so that when the bias is at the greater bias point 58, intersecting a steeper portion of the IV curve 50, a greater amplitude output signal 52 is created, whereas when the bias is at the lesser bias point 58, intersecting a less steep slope of the curve 50, a lesser amplitude output signal 52 is output from the waveguide output 18.

Alternatively, the modulation signal 56 may be mixed with the input signal 40 through the agency of the resonant pillar 30 which provides a non-linear connection to the central conductor 14. Mixing in this context refers to an operation of accepting two (or more) different input frequencies and presenting at an output a mixture of signals including output signals having frequencies equal to a sum and difference of the two input frequencies. The mixing is effected by the nonlinear IV curve which in turn is caused by the effect of mechanical oscillation of the pillar 30 on transport of electrons.

In this way, it will be understood that by a proper selection of the signal level of the input signal 40 and modulation signal 56 and a selection of the direct-current bias voltage 38, rectification, mixing, modulation, and frequency filtration may all be accomplished.

Figure 6:
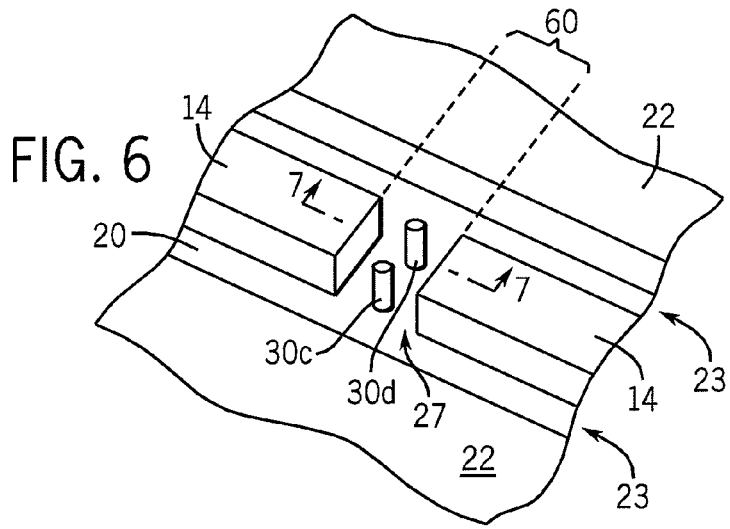
FIG. 6 is a figure similar to that of FIG. 2 showing an alternative embodiment providing a band pass filter using multiple identically resonant mechanical pillars for impedance control purposes.

Referring now to FIG. 6, a pass band filter may be created by providing a gap 60 in the central conductor 14 and positioning mechanically resonant pillars 30c and 30d within the gap 60. In this embodiment, current flowing along the central conductor 14 from the waveguide input 16 to the waveguide output 18 must pass across one of the pillars 30c and 30d oscillating along the axis of the central conductor 14. Referring also to FIG. 3, in this embodiment, filtration is also provided, but instead of rejection bands 34, pass bands 62 may be created. As before multiple different pillars of different resonant frequencies may be used to create an arbitrary past band profile.

In the example of this embodiment, the mechanical properties of pillars 30c and 30d are identical to provide a single pass band 62. Multiple pillars 30 of the same size allow control of the amount of current flowing for a given signal voltage level and thus provide a means for controlling the current flow or the impedance of the system, important for providing a control of the mixing while preserving the characteristic impedance co-planar waveguide 12.

Figure 7:
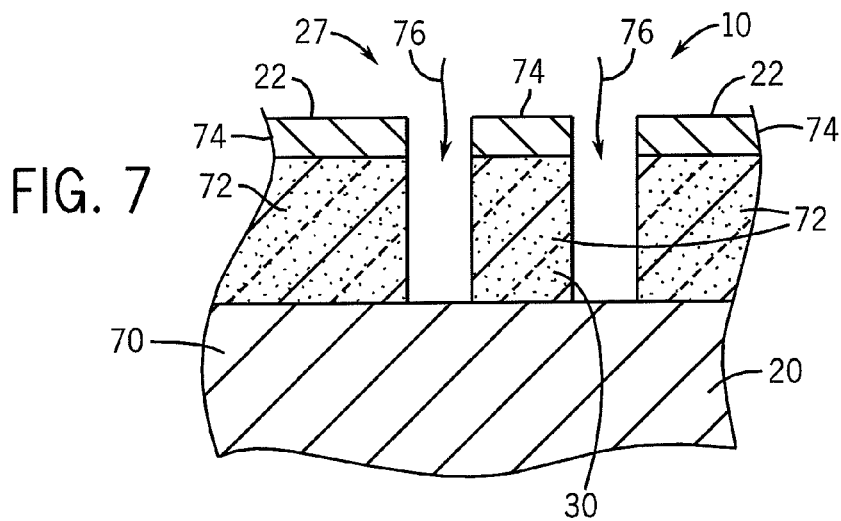
FIG. 7 is an elevational cross-sectional view taken along 7-7 of FIG. 6 showing the fabrication of the devices of FIGS. 1 through 6.

Referring now to FIG. 7, the transfer cells 27 and the co-planar waveguide 12 may be fabricated without cantilevered or gap spanning structures and thus can be produced without integrated circuit fabrication processes that require the use of sacrificial layers or the like. A particular advantage of the present invention is the limited number of processing steps required to form the transfer cells 27 and the co-planar waveguide 12, and the compatibility of such processing steps with conventional semiconductor integrated circuit manufacturing.

The electronic device 10 can be formed in two steps on a standard SOI substrate 20 having an insulating layer 70 (for example silicon dioxide) with a thin silicon (or other semiconductor) layer 72 formed thereon. In a first step for processing of the SOI wafer, the gold layer 74 applied by sputtering or similar metallization techniques and then a pattern defined using nano-scale lithography, such as by utilizing e-beam lithography via a scanning electron microscope (SEM). After the patterned gold layers 74 are formed, the substrate 20 is then moved to a reactive ion etcher (RIE) where dry etching is carried out. The etching process 76 attacks the semiconductor layer 72 that is not covered by the gold layer 74 and mills down the silicon in a direction perpendicular to the plane of the substrate 20. The lithographically defined gold layer 74 thus acts both as electrical conductors for the central conductor 14, the supplemental conductors 24, the top of the pillars 30, and the co-planar ground conductors 22, and as an etch mask for the RIE process. In the etching process, the vertical pillar 33 may be formed to have essentially vertical sidewalls (as shown) or it may have an area of reduced horizontal cross-section to form a waist. The cross-section of the pillar may have a square or other polygonal shape or may be substantially circular. The formation of the narrowed waist may be selected to select the resonant frequency of the pillar 33.

Figure 9:
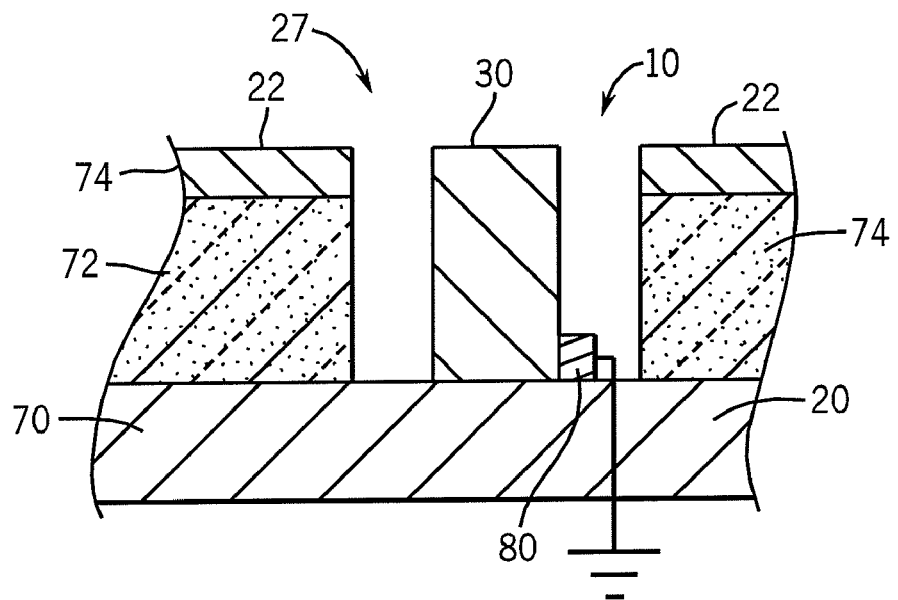
FIG. 9 is a figure similar to that of FIG. 7 showing an alternative embodiment in which the mechanically resonant pillar is connected to ground.

Referring now to FIG. 9, in an alternative embodiment the entire pillar 30 may be made conductive, for example, by heavy doping, and may be connected to ground, for example, by a metallization path 80 contained in the etched gaps between the pillar 30 and the co-planar ground conductors 22. This same conductive path 80 may be used in addition or alternatively for pre-charging the pillars 30.

Figure 8:
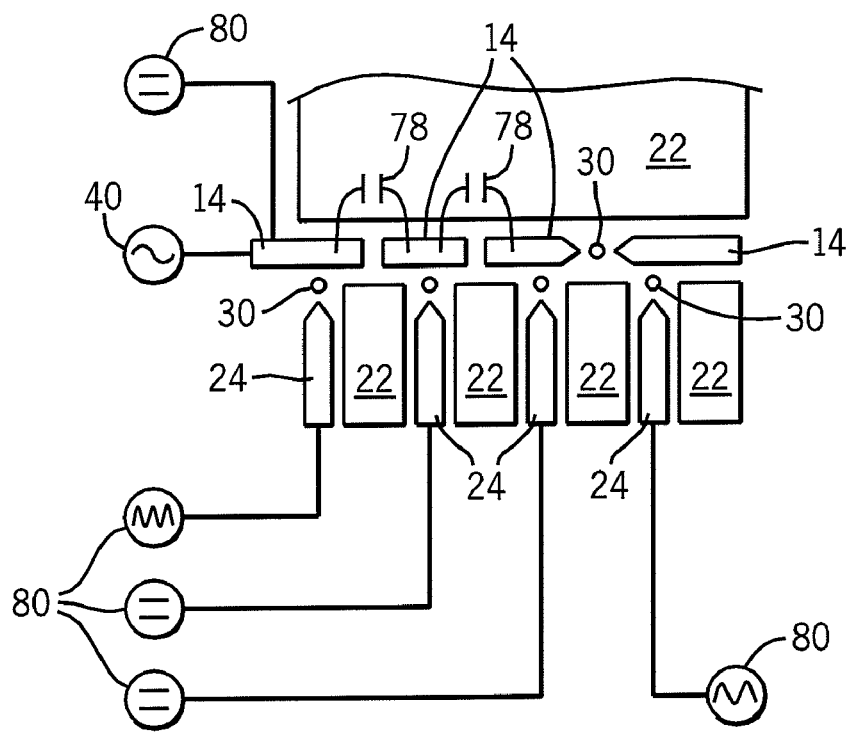
FIG. 8 is a schematic representation of a complex device constructed of multiple transfer cells of FIGS. 1 through 6 interconnected by a co-planar waveguide.

Referring now to FIG. 8, the co-planar waveguide 12 allows multiple transfer cells 27, providing the various functions described above, to be flexibly interconnected to create complex signal processing electronic devices 10. For example, multiple supplemental conductors 24, each connected to different ones of DC bias or mixing or modulating signals 80, may communicate these signals to different transfer cells 27 with individually tuned single or multiple pillars 30 positioned between supplemental conductors 24 and the central conductor 14 or within gaps in the central conductor 14 to create various filter modulators and mixers. Blocking capacitors 78 may be inserted into the central conductor 14 as appropriate to allow separation of DC bias levels.

While the present invention has been described with respect to etched pillars 30 it will be understood that other fabrication techniques may be used including those which grow or attach comparable pillars to the substrate, for example, by the mounting of carbon nano tubes or the like. The term co-planar as used herein is intended to refer to structures in which current carrying elements have no substantial overlap, or that do not require substantial overlapping of conductors for their function, along a line perpendicular to the surface of the substrate, and this term therefore admits to minor amounts of metallization extending down the sides of electrically isolated elements.

It is specifically intended that the present invention not be limited to the embodiments and illustrations contained herein, but include modified forms of those embodiments including portions of the embodiments and combinations of elements of different embodiments as come within the scope of the following claims.

What we claim is:

1. A method of processing electrical signals in a megahertz or greater frequency range comprising the steps of:
    (a) introducing a signal to a co-planar waveguide, the co-planar waveguide providing a central conductor for receiving an input signal at a waveguide input and providing an output signal at a waveguide output, the central conductor supported by a insulating planar substrate and flanked on either side by ground conductors substantially parallel to each other and the central conductor also supported by the insulating planar substrate and spaced from the central conductor by gaps having a substantially predetermined dielectric, the gaps providing a predefined capacitance which together with an intrinsic inductance of the central conductor produces a predetermined characteristic impedance of a waveguide structure allowing impedance matched, low-loss transmission of high-frequency signals in at least one of the megahertz and gigahertz range; and
    (b) exciting into resonance at least one mechanically resonant pillar extending upward from the insulating planar substrate within the co-planar waveguide, the mechanically resonant pillar supporting a conductor, the conductor transferring electrons from the central conductor as received from the waveguide input to a second conductor with mechanical movement of the resonant pillar; and
    (c) extracting a modified signal from the waveguide output.

2. The method of claim 1 wherein the step of exciting the pillar into resonance employs an AC biasing voltage across the pillar.

3. The method of claim 1 wherein the step of exciting the pillar into resonance employs a DC biasing voltage across the pillar to cause self-excitation of the pillar.

4. The method of claim 1 wherein the mechanically resonant pillar has a natural resonant frequency equal to a desired pass band and wherein the mechanically resonant pillar is positioned within a gap in the central conductor.

5. The method of claim 1 wherein the mechanically resonant pillar has a natural resonant frequency equal to a desired rejection band and wherein the mechanically resonant pillar is positioned between the central conductor and a ground conductor.

6. A method of processing electrical signals in a megahertz or greater frequency range comprising the steps of:
    (a) introducing a signal to a conductor, the conductor for receiving an input signal at an input and providing an output signal at an output, the conductor supported by an insulating substrate and having a gap between the input and output; and
    (b) exciting into resonance at least one mechanically resonant pillar extending upward from the insulating planar substrate within the gap, the mechanically resonant pillar supporting a pillar conductor, the pillar conductor transferring electrons from the conductor as received from the input across the gap to be provided to the output with mechanical movement of the resonant pillar; and
    (c) extracting a modified signal from the output; and
    further including the step of providing a steady state bias current across the mechanically resonant pillar to provide a rectification of current flowing via the mechanically resonant pillar.

7. A method of processing electrical signals in a megahertz or greater frequency range comprising the steps of (a) introducing a signal to a conductor, the conductor for receiving an input signal at an input and providing an output signal at an output, the conductor supported by an insulating substrate and having a gap between the input and output; and (b) exciting into resonance at least one mechanically resonant pillar extending upward from the insulating planar substrate within the gap, the mechanically resonant pillar supporting a moving conductor, the moving conductor transferring electrons from the conductor as received from the input across the gap to be provided to the output with mechanical movement of the resonant pillar; and (c) extracting a modified signal from the output; and further including the step of providing a modulated bias voltage across the mechanically resonant pillar to provide a multiplication term of a signal on the conductor times the modulated bias voltage.

* * * * *